(12) United States Patent
Hsu (10) Patent No.: US 6,472,933 B2
(45) Date of Patent: *Oct. 29, 2002

(54) SWITCHING AMPLIFIER INCORPORATING RETURN-TO-ZERO QUATERNARY POWER SWITCH

(75) Inventor: Wei-Chan Hsu, San Jose, CA (US)

(73) Assignee: Waytech Investment Co., Ltd., Tortola (VG)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/407,102

(22) Filed: Sep. 27, 1999

(65) Prior Publication Data

US 2002/0075068 A1 Jun. 20, 2002

(51) Int. Cl.[7] .............................. H03F 3/38; H03F 3/217
(52) U.S. Cl. ...................................... 330/10; 330/207 A
(58) Field of Search .............................. 330/10, 207 A, 330/251

(56) References Cited

U.S. PATENT DOCUMENTS 5,077,539 A * 12/1991 Howatt .......................... 330/10
5,617,058 A *  4/1997 Adrian et al. .................. 330/10

OTHER PUBLICATIONS

Ohr, Stephan, "New Funding Preps TriPath for Communications Push", EETimes, Oct. 26, 1998, p. 37.

* cited by examiner

Primary Examiner—Steven J. Mottola
(74) Attorney, Agent, or Firm—Carr & Ferrell LLP (57) ABSTRACT

Invention resides in a switching amplifier having a quaternary input control signal that provides quaternary levels (1, 0H, −1, and 0L) which is coupled to an H-bridge amplifier to provide error cancellation in switching amplifier output signal. The quaternary control signal alternates from a zero state at a high level ("0H") to a zero state at a low level ("0L") between each non-zero state (+1 or −1). In a preferred embodiment, a three-level sigma-delta modulator is provided for greater operational efficiency for ease of detecting zero states and minimizing power. The three-level sigma-delta modulator receives and converts an amplifier input signal into a ternary output signal that is then coupled to a ternary-to-quaternary converter to generate the quaternary control signal to provide as input to the H-bridge.

15 Claims, 9 Drawing Sheets

FIG. 11

SWITCHING AMPLIFIER INCORPORATING RETURN-TO-ZERO QUATERNARY POWER SWITCH

FIELD OF INVENTION

Invention relates to amplifier circuits, and more particularly to switching amplifier power switch.

BACKGROUND OF INVENTION

Figure 1:
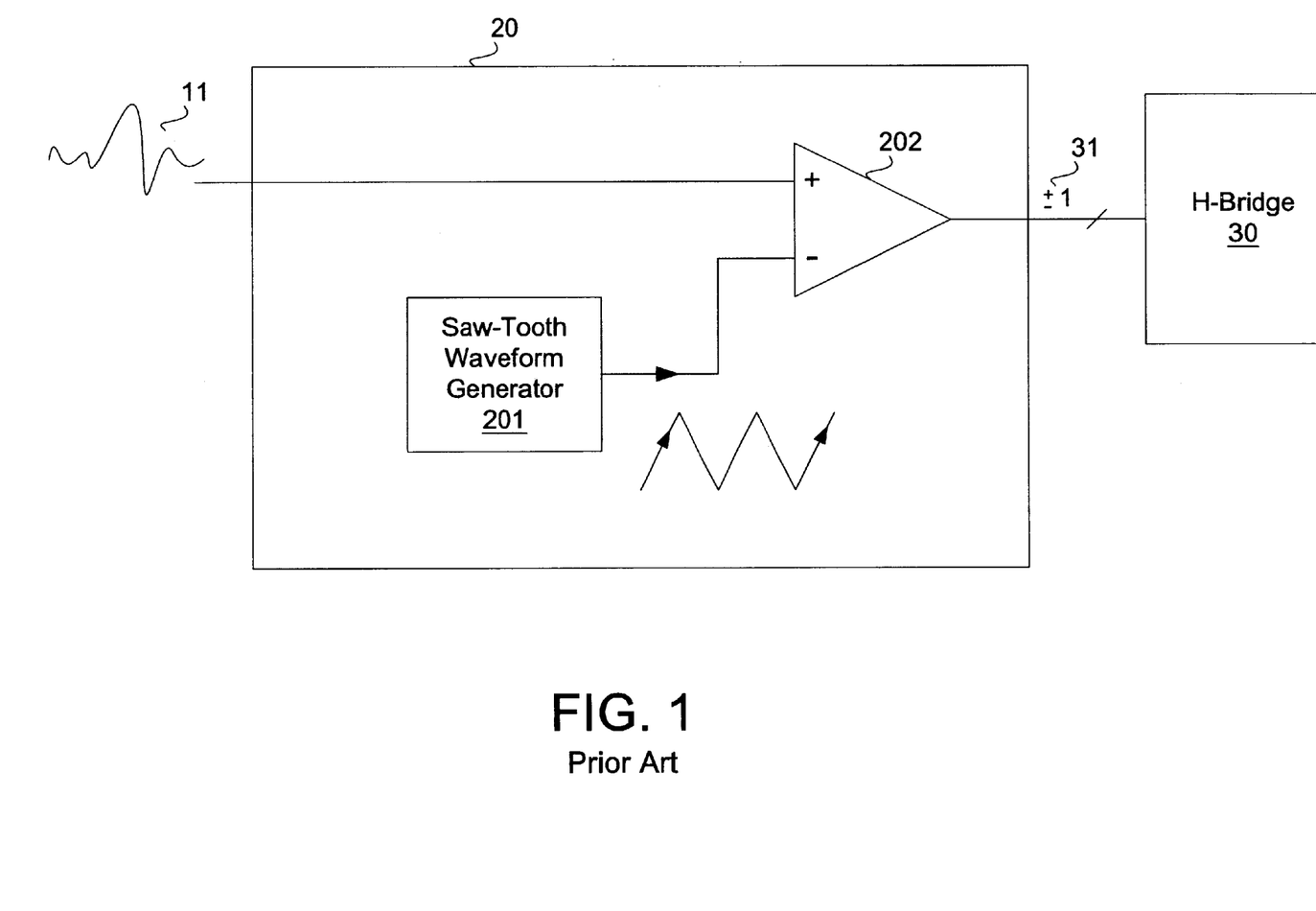
FIG. 1 illustrates a typical Class-D amplifier.
Figure 2:
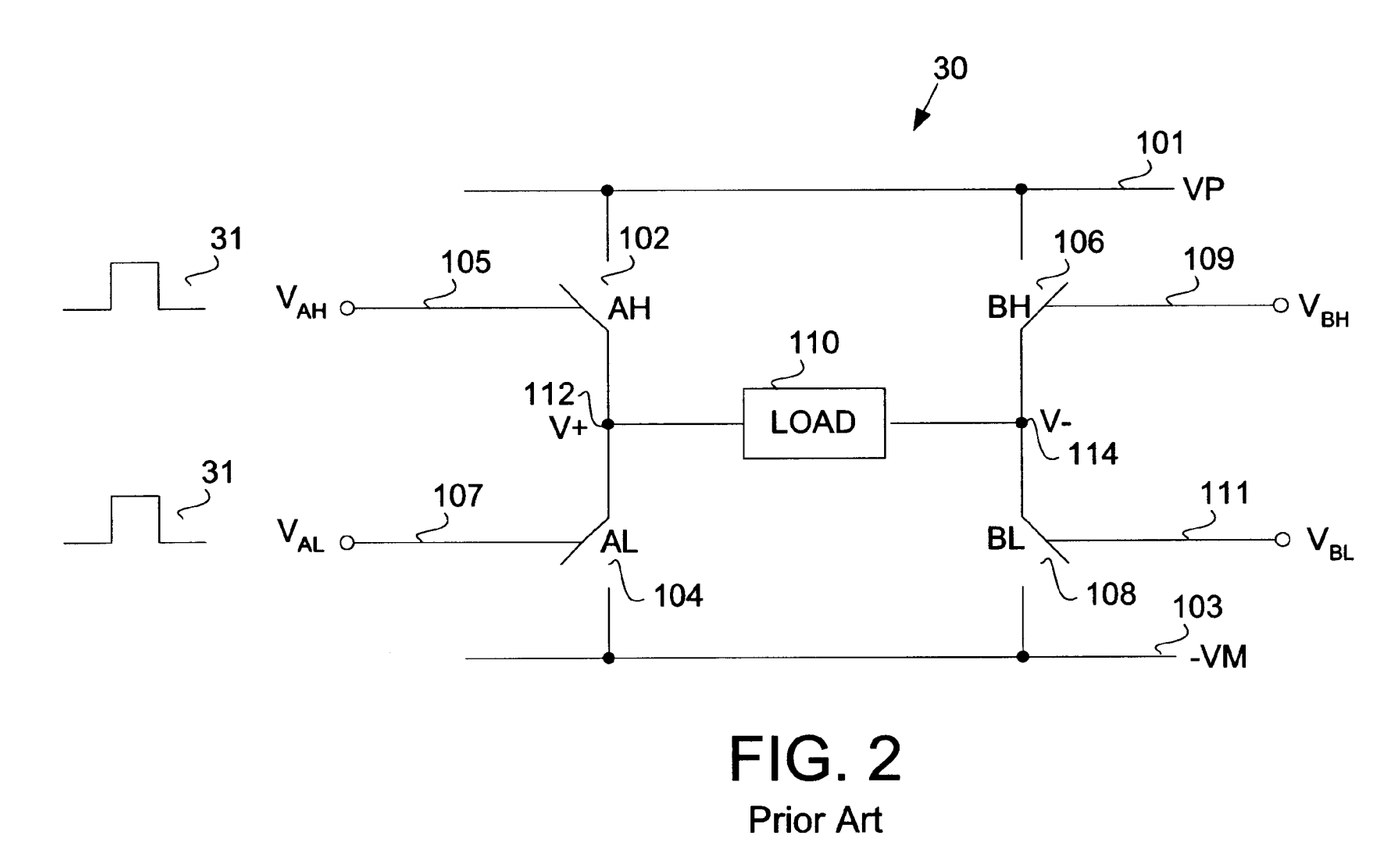
FIG. 2 illustrates a typical H-bridge.

"Typical Class-D amplifier such as that of Texas Instrument (TI) Cass D Stereo Audio Power Amplifier described in TI TPA005D02 Class D Stereo Audio Power Amplifier Evaluation Module User's Guide comprises an analog input and an analog output. A simplified Class-D amplifier is illustrated in FIG. 1. The amplifier constitutes two parts: the control circuit 20 and the H-bridge 30. The control circuit 20 consists of a saw-tooth waveform generator 201 and a comparator 202. The analog input 11 is compared with the saw-tooth waveform to produce a binary digital output 31. The binary digital output is then used to control the ON/OFF of an output power stage such as an H-bridge circuit 30. As shown in greater detail in FIG. 2, H-bridge circuit 30 comprises two pairs of switches, a first pair of switches: switch 102 (AH) and switch 104 (AL), and a second pair of switches: switch 106 (BH) and 108 (BL). Each pair of switches comprises a first switch (i.e., AH or BH) connected to a positive power supply 101 (VP) and a second switch (i.e., AL or BL) that is connected to a negative power supply 103 (VM) to thereby switch amplifier 20 between a positive and negative digital output state (i.e., equivalent to a digital "+1" output voltage and a "−1" output voltage) via a set of input switch control signals 105, 107, 109, and 111 (VAH, VAL, VBH, and VBL, respectively). The output load 110 is connected to the output switches via the output nodes 112 (V+) and 114 (V−) as shown in FIG. 2. During the "+1" state, the set of amplifier switch control signals 105, 107, 109, and 111 controlling switches, AH, AL, BH, and BL are designed to connect node 112 (V+) to positive power supply (VP) and node 114 (V−) to negative power supply (VM). During the "−1" state, the set of amplifier switch control signals 105, 107, 109, and 111 controlling switches, AH, AL, BH, and BL are designed to connect node 112 (V+) to negative power supply (VM) and node 114 (V−) to positive power supply (VP). For traditional Class-D amplifier, the output switches between "+1" and "−1" states alternatively depends on the control circuit 20. Depending upon the nature of the input waveform, the switch-on time for the pull-up and pull-down transistors can be very narrow such that the pulse is shorter or comparable to the rise time or fall time of the power switches 105, 107, 109, 111. This correspondingly also results in distortion in the output circuit. In real implementations, special transistors (e.g., DMOS or JFET) are used in the H-bridge since they have much faster turn-on time that a standard MOS transistor. An apparent drawback for this type of Class-D amplifier is that while the control circuit 20 in FIG. 1 can be implemented in CMOS, the H-bridge is typically outside the controller circuit. Since modern VLSI adapts CMOS as the dominant technology due to its advantage of lower cost and high integration capability. The integration level is not optimum and hence the cost is higher than a single integrated CMOS Class-D amplifier."

Another prior solution, such as shown in U.S. Pat. No. 5,777,512 ("the '512 Patent"), includes a feedback loop to reduce the overall harmonic distortion of the H-bridge. In the '512 Patent, an analog sigma-delta modulator is used to produce the binary digital output, and the output of the amplifier is then fed back to the sigma-delta loop to reduce the distortion. Both the traditional saw-tooth and binary sigma-delta modulation provide poor power efficiency due to their frequent switching even when there are little or no input signals. Another problem is caused by the binary nature of the output state and finite turn-on resistance associated with the transistors of the H-bridge is that there will always be power consumed by these transistors regardless of the shape or amplitude of the input signal. As illustrated in FIG. 2, due to the binary nature of the output state, at any given time, either the transistor 102 and 108 are "ON" (+1 state), or 106 and 104 are "ON" (−1 state). In either case, there is a current path from positive supply 101 to negative power supply 103. The power consumed by each transistor 102, 104, 106, and 108 is the product of the current times the turn-on resistance associated with each transistor. Thus, because of these binary states, power consumption is always present even if there is no input signal to amplify.

"In U.S. Pat. No. 5,077,539 ("the '539 Patent), a ternary output switching amplifier is introduced. A major advantage of the ternary output switching amplifier is the higher power efficiency for small input signal. This efficiency is achieved by introducing the third state 0. In FIG. 2, when the amplifier outputs a 0 state, both output terminals 112 (V+) and 114 (V−) of output load 110 are short circuited to a supply voltage of a pre-determined polarity, i.e., the positive power supply voltage. Since both the output terminals have the same voltage, there is no current flow through the load and the transistors 102, 104, 106, and 108, hence the power consumption is zero during 0 state. If designed properly, for a small amplitude input signal, the output preferably will have many 0 states and the power consumption is then much smaller than the binary switching amplifiers described earlier. One possible implementation of ternary switching amplifier is disclosed in U.S. Pat. No. 5,617,058 ("the '058 Patent"), in which a pulse width logic is used to convert digital data into a ternary switching signal. While the ternary power switch amplifier can achieve higher power efficiency than binary power switch amplifiers, there is significant harmonic distortion caused by the error caused by the error voltages associated with the output transistors as explained below:"

Figure 5:
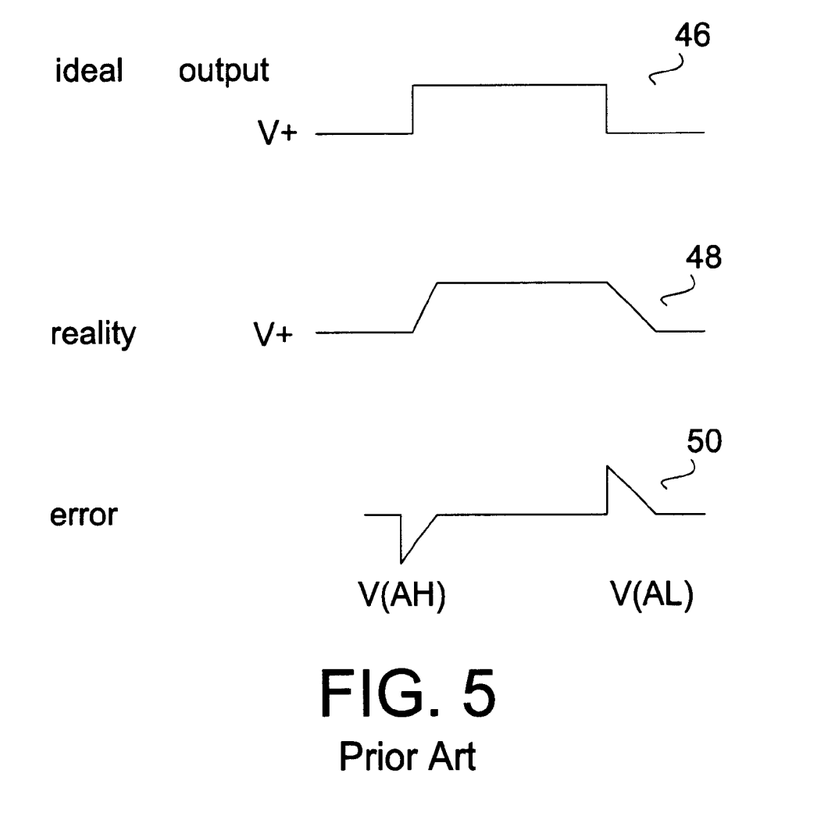
FIG. 5 illustrates a sample comparison between an ideal amplifier output signal, a more realistic amplifier output signal, and the illustrative error between the ideal and the real amplifier output signal.

As illustrated in FIG. 5, there are error voltages associated with the output nodes V+ and V− switching between the positive and negative supply voltages. The associated error voltages result from the finite rise and fall time as well as the settling time of the output transistors 102, 104, 106, and 108. The error voltages associated with these transistors are correspondingly denoted as V(AH), V(AL), V(BH) and V(BL). To simply the analysis, we assume that error occurs when the transistors change from "Off" (opened) to "ON" (closed). Since the turn-off time of a transistor is independent of the load and can be well controlled, it is typically much shorter than the turn-on time. Thus, the error associated with the turn-off time of a transistor is much shorter than that associated with the turn-on time of a transistor. We therefore neglect its effect in the following analysis. In the preferred typical implementation, the transistors 102 and 106 are of the same type (for example PMOS) and transistors 104 and 108 are of the same type (for example NMOS) and are operated under the same switching condition. Thus, V(AH)=V(BH), and V(AL)=V(BL). On the other hand, the pull-up transistors 102 and 106, and the pull-down transistors 104 and 108 are typically of different type or switched under different conditions. Hence, these transistors are not matched, and consequently V(AL)≠V(AH) and V(BL)≠V (BH). Accordingly, due to this mismatch, the ternary switching sequence introduces substantial harmonic distortion at the output.

Figure 4:
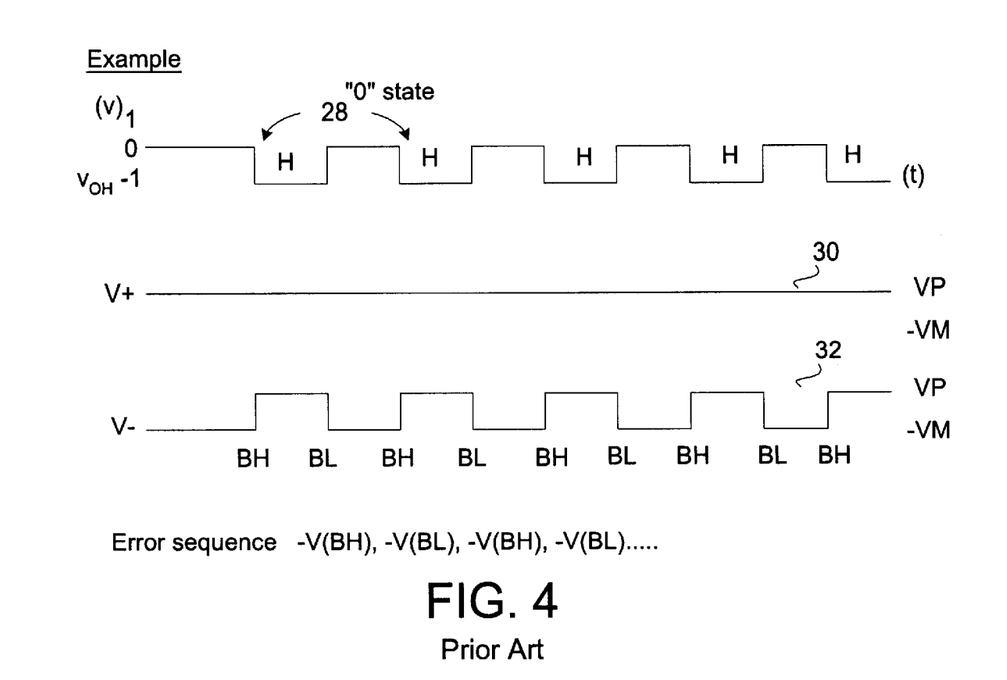
FIG. 4 shows a more detailed illustration of prior art control switching sequence of FIG. 3.

For example, consider the switching sequence shown in FIG. 4 wherein the output switches between just the +1 state and the 0 state. At each occurrence of a 0 state, both nodes V+ and V− of load 110 are typically switched "HIGH" to supply VP (referring to FIG. 2). As seen from FIG. 4, the positive end of the load (V+) always remain at VP, while the negative end of the load (V−) switches to VP at each occurrence of a 0 state. Input switch control signals are designed to alternately switch BH and BL close. Since the rise time and fall time of switches BH and BL do not typically match, the harmonic distortion is increased from the switching operation. From another perspective, for ternary and "return-to-zero" switching amplifier, there are only two kinds of state transition between two 0 states. These state transitions are:

1. 0→+1→0
2. 0→−1→0

As illustrated in FIG. 2, during a 0 state, i.e., both V+ and V− are at the positive supply VP, hence transistors 102 and 106 are closed while transistors 104 and 108 are open as shown in Table 1.

TABLE 1

Ternary Switch Control States

| Amplifier Output State | Transistor Pairs States |
|---|---|
| +1 | (AH, BL) Closed, (AL, BH) Opened |
| −1 | (AH, BL) Opened, (AL, BH) Closed |
| 0 | (AH, BH) Closed, (AL, BL) Opened |

For 0→1 transition, the transistor BL switches from opened to closed. The error voltage associated with this operation is −V(BL). The minus sign accounts for the fact that switch BL connects to the negative output V−. For 1→0 transition, BH changes from opened to closed. The error voltage associated with this operation is V(BH). The total error voltage for this 0→1→0 transition is therefore −V(BL) +V(BH). As explained earlier, transistors BL and BH do not match, and hence there is a residual error voltage associated with this transition. Similarly, for the transition 0→1→0, this residual error voltage buildup also applies to produce a residual error voltage corresponding to V(AL)−V(AH). The error voltages associated with these two transition types are summarized in TABLE 2.

TABLE 2

Ternary Switching Error Voltages

| Transition Type | OFF to ON at The First Edge | OFF to ON at The Second Edge | Error Voltage |
|---|---|---|---|
| 0→1→0 | BL | BH | −V(BL) + V(BH) |
| 0→1→0 | AL | AH | V(AL) − V(AH) |

Figure 3:
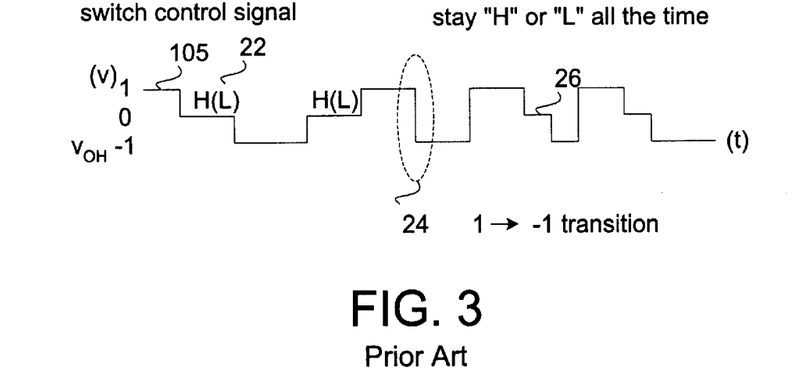
FIG. 3 illustrates a prior art control switching sequence output.

Since the occurrence for these two types of transition 0→1→0 and 0→−1→0 depend on the input signal, the residual voltages causes overall harmonic distortion and noise of the output. In addition, if there is a (1 to −1) or (−1 to 1) transition as illustrated in FIG. 3, the combined error voltage is further compounded for turning two output switches from OFF to ON at the same time. There is therefore a need for an improved switching amplifier circuit that minimizes residual error voltage, the harmonic distortion, as well as noise output during switching operations.

SUMMARY OF THE INVENTION

Invention resides in a switching amplifier comprising amplifier input control signals that generate four digital output levels (1, 0H, 0L, −1). The control signals input are designed to generate an alternating zero output states, alternating from a zero state at a High level 0H to a zero state at a Low level 0L between each non-zero state. The 0H state comprises short circuiting a load of the amplifier to a positive voltage VP, the 0L comprises short circuiting the load to the negative voltage supply VM, and the "non-zero state" being either a positive (+1) or a negative (−1) output state. With an alternating zero output state between each positive (+1) and negative (−1) output state, error voltage cancellation is achieved to thereby minimize the error voltage and associated harmonic distortion and noise associated at the output of the switching amplifier during switching operations.

DETAILED DESCRIPTION OF PREFERRED EMBODIMENT(S)

Figure 6:
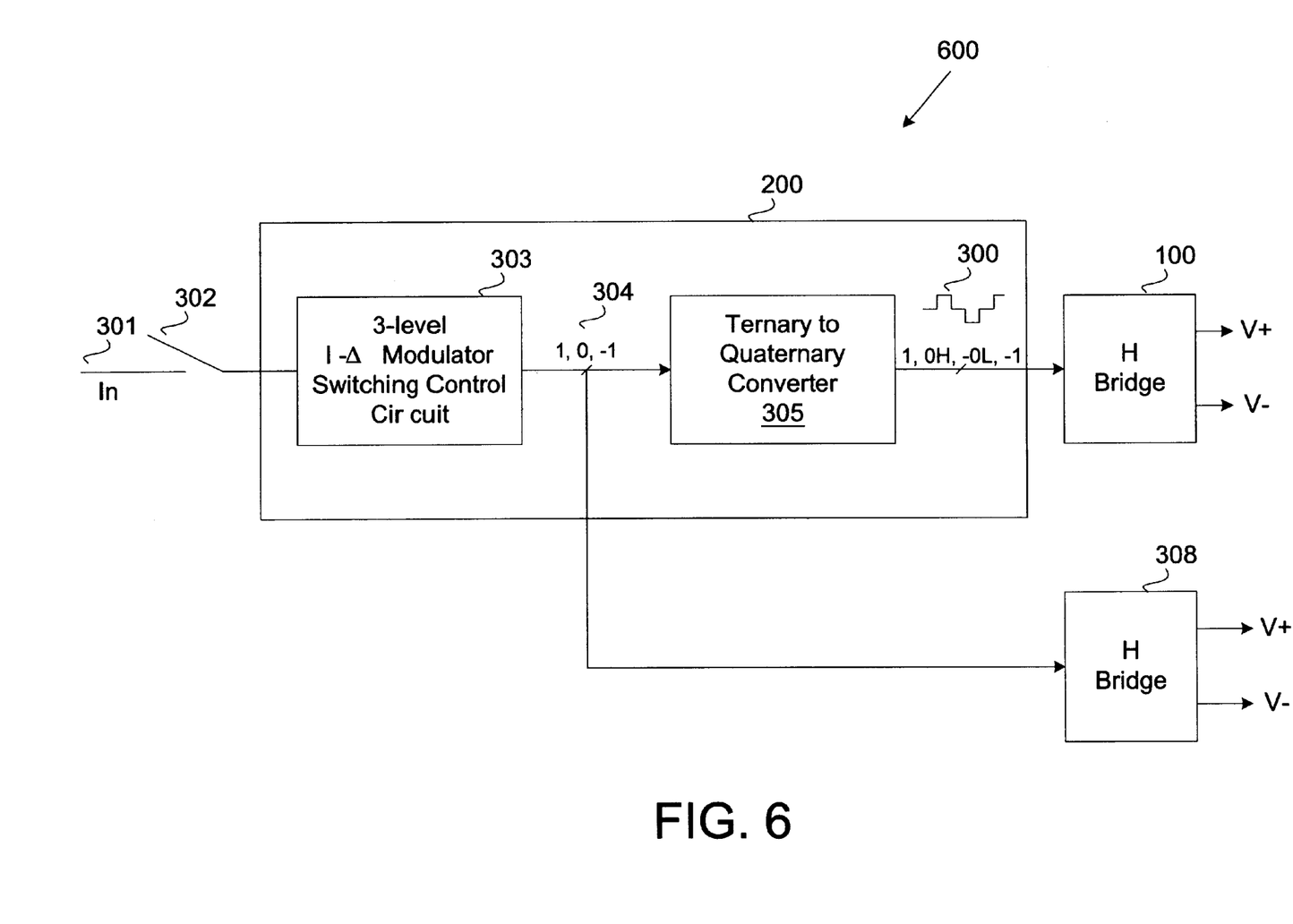
FIG. 6 illustrates a switching amplifier incorporating return-to-zero quaternary power switch provided in accordance with the principles of this invention.

An improved switching amplifier incorporating return-to-zero quaternary power switch 600 as illustrated in FIG. 6 comprises a switch control circuit 200 and an H-bridge circuit 100 implementing quaternary switch control signal 300 in accordance with the principles of this invention. Switch control circuit 200 produces a quaternary output signal 300 comprising four states (+1, 0H, −1, and 0L), otherwise referred herein as "quaternary states", as will later be explained in further detail. Quaternary state signal 300 is used to control the output H-bridge 100. Switch control circuit 200 can comprise a digital circuit if its input signal 301 comprises a digital waveform, or an analog and digital circuit combination if input 301 is an analog waveform. The operational principle of this invention remains the same in both cases. If switch control input signal 301 is an analog signal waveform, switching amplifier 100, also referred to herein as an H-bridge circuit comprises a traditional Class-D amplifier 30 such as illustrated in FIG. 1. If the input is a digital signal waveform, then switching amplifier 100 comprises a digital-to-analog converter (DAC). The switching amplifier incorporating return-to-zero quaternary power switch in accordance to the principles of this invention applies to both cases and provides an efficient method to amplify input signal 301.

As illustrated in FIG. 6, one preferred implementation of the switch control circuit 200 comprises a three-level sigma-delta modulator 303 (see FIG. 10), which produces ternary states comprising three output states (1, 0, or −1). These ternary output states are then mapped into a quaternary state sequence via a ternary-to-quaternary converter 305, described further below, to generate quaternary state signal 300 provided as input to H-bridge 100. A three-level signal-delta modulator 305 detects and generates greater number of zero (0) states when the input signal level is very low. Thus compared to the traditional saw-tooth driven Class-D amplifiers, greater efficiency for switching amplifier 600 results because there is no current consumption if the H-bridge is driven by a zero state.

Figure 7:
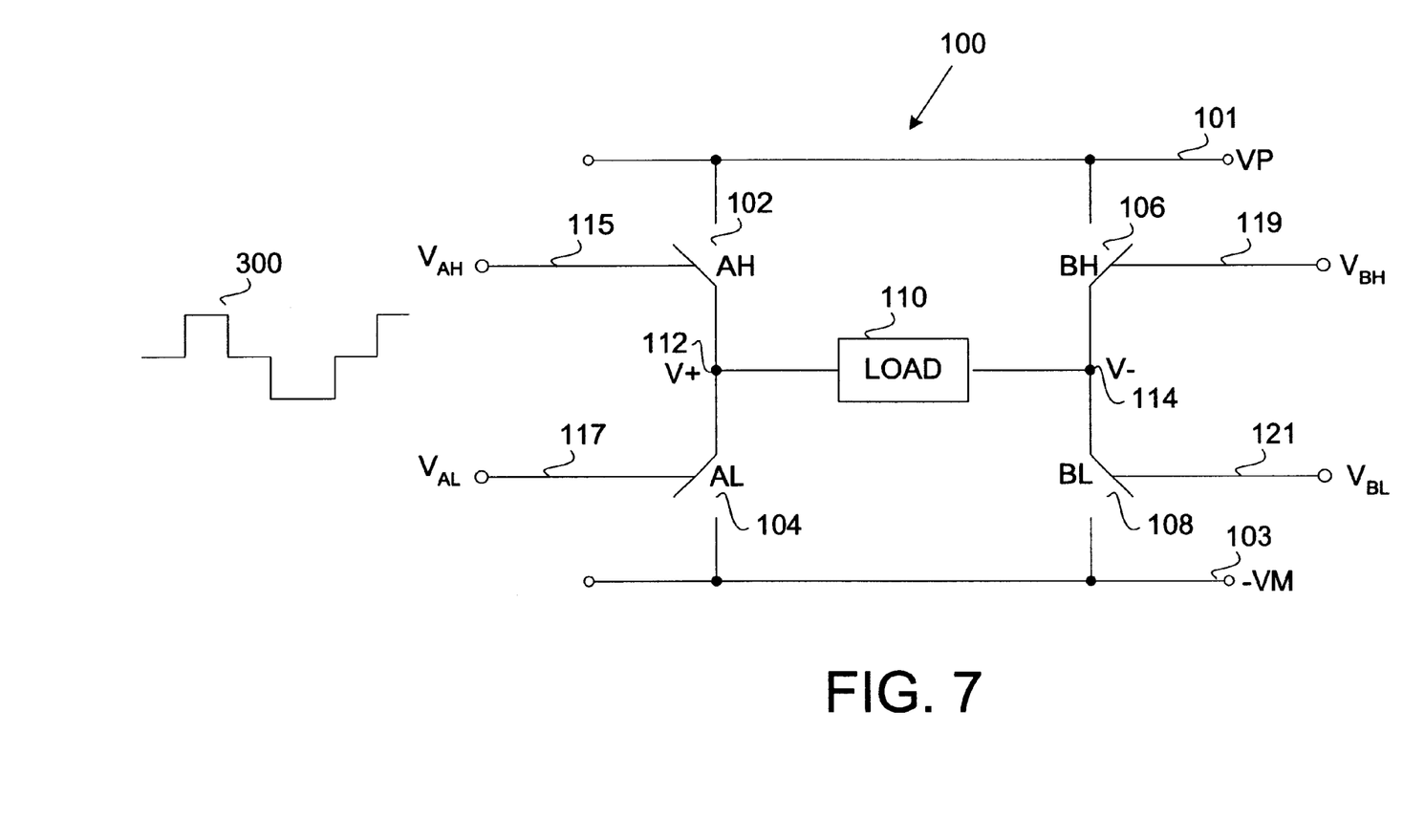
FIG. 7 illustrates a more detailed embodiment of an H-bridge circuit having a return-to-zero quaternary switching control signal in accordance with the principles of this invention.

FIG. 7 illustrates a full H-bridge circuit 100 comprising return-to-zero quaternary switch control input signal 300 provided in accordance with the principles of this invention. H-bridge 100 of FIG. 7 is similar to the typical H-bridge 30 of FIG. 1, except for the quaternary input switch control signal 300 provided to drive the operation of H-bridge 100. Thus, for the sake of convenience, references to the same reference numerals used here refer to the same switches described above with above figures. A load 110 is driven by two pairs of switches, a first pair of switches comprising a first transistor 102 (AH) and a second transistor 104 (AL), and a second pair of switches comprising a third transistor 106 (BH) and a fourth transistor 108 (BL). An output of switch amplifier 100 comprises the voltage difference across a load 110, between two terminals, a first terminal 112 (V+) and a second terminal 114 (V−).

Input control signals 115, 117, 119 and 121 are designed for controlling the four switches AH, AL, BH, and BL, respectively to thereby generate four amplifier output states positive ("+1"), "zero-High" ("0H"), "zero-Low" ("0L"), and negative ("−1") according to the following configuration described in Table 3:

TABLE 3

Quaternary Switch Control States

| Amplifier Output State | Transistor Pairs States |
| --- | --- |
| +1 | (AH, BL) Closed, (AL, BH) Opened |
| −1 | (AH, BL) Opened, (AL, BH) Closed |
| 0H | (AH, BH) Closed, (AL, BL) Opened |
| 0L | (AH, BH) Opened, (AL, BL) Closed |

As illustrated in Table 3, input control signals to transistors AH, AL, BH, and BL, are provided to produce the transistor states described in column 2 and to generate the corresponding amplifier output state illustrated in column 1. In the preferred embodiment, input switch control signals comprise input clock signals, thus guaranteeing minimum state duration time. Clock period is preferably much longer than the rise/fall time of each switch.

In one embodiment, quaternary states can be generated from ternary states. For states +1 and −1, they are the same as the states +1 and −1 of ternary states. As shown in Table 1, at +1 state, switches (AH, BL) are closed, while switches (AL, BH) are opened. During this state, node 112 (V+) is at positive supply voltage VP, and node 114 (V−) will be at negative voltage VM. At state −1, switches (AL, BH) are closed, while switches (AH, BL) are opened. V+ is at negative voltage VM, and node V− is at positive voltage VP. Amplifier output state 0 of ternary states can be generated using the following two options alternatively:

0H : Switches (AH, BH) closed, and switches (AL, BL) opened. Both nodes V+ and V− are essentially at positive supply voltage VP, and consequently net output voltage (V+−V−) is zero since V+=V−=VP. We refer to this zero state as 0H , for zero-high state.

0L: Switches (AH, BH) open, and switches (AL, BL) close. Both V+ and V− are essentially at negative supply, VM, and thus net output voltage (V+− V−) is zero, since V+=V−=VM. We refer to this zero state as 0L , for zero-low state.

Like the 0 state in ternary switching amplifier, 0H and 0L states of this invention consumes no current and hence have no power consumption. A properly designed switching control circuit utilizes this property and achieves good power efficiency. Furthermore, it will be shown that by alternating 0L and 0H states, the output distortion associated with the finite rise and fall time and settling time of the output transistors are greatly reduced.

According to the principles of this invention, switch control signals at the input of switches AH, AL, BH, and BL have following characteristics:

Four-state switching (+1, 0H , 0L , −1), power efficiency is achieved for small signal inputs;

A "return to zero" transition (i.e., 0H and 0L ) from state +1 to state −1 and vice versa.

Switch control signals comprise input clock signals, thus guaranteeing minimum state duration time. Clock period is designed to be much longer than rise/fall time of switch.

Between each non-zero state +1 or −1, load 100 is alternately short circuited to positive voltage VP and negative voltage VM, which corresponds to the 0H and 0L states.

Figure 8:
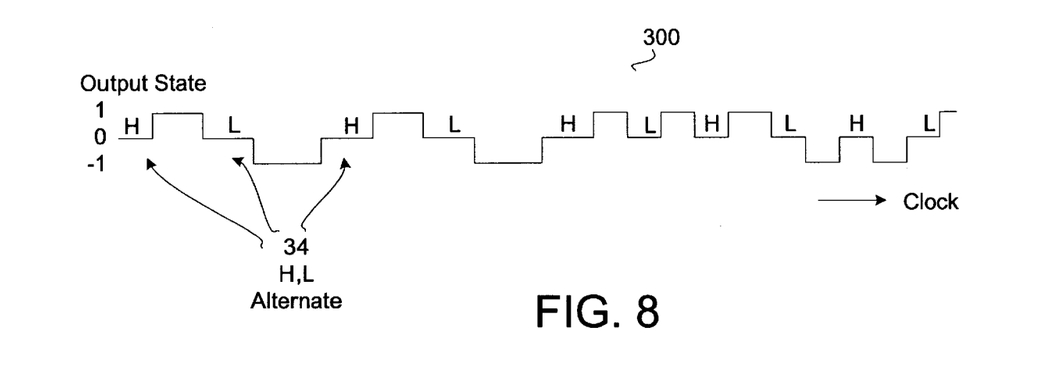
FIG. 8 illustrates a sample signal waveform of the return-to-zero quaternary switching control signal of FIGS. 6 and 7 in accordance with the principles of this invention.
Figure 9:
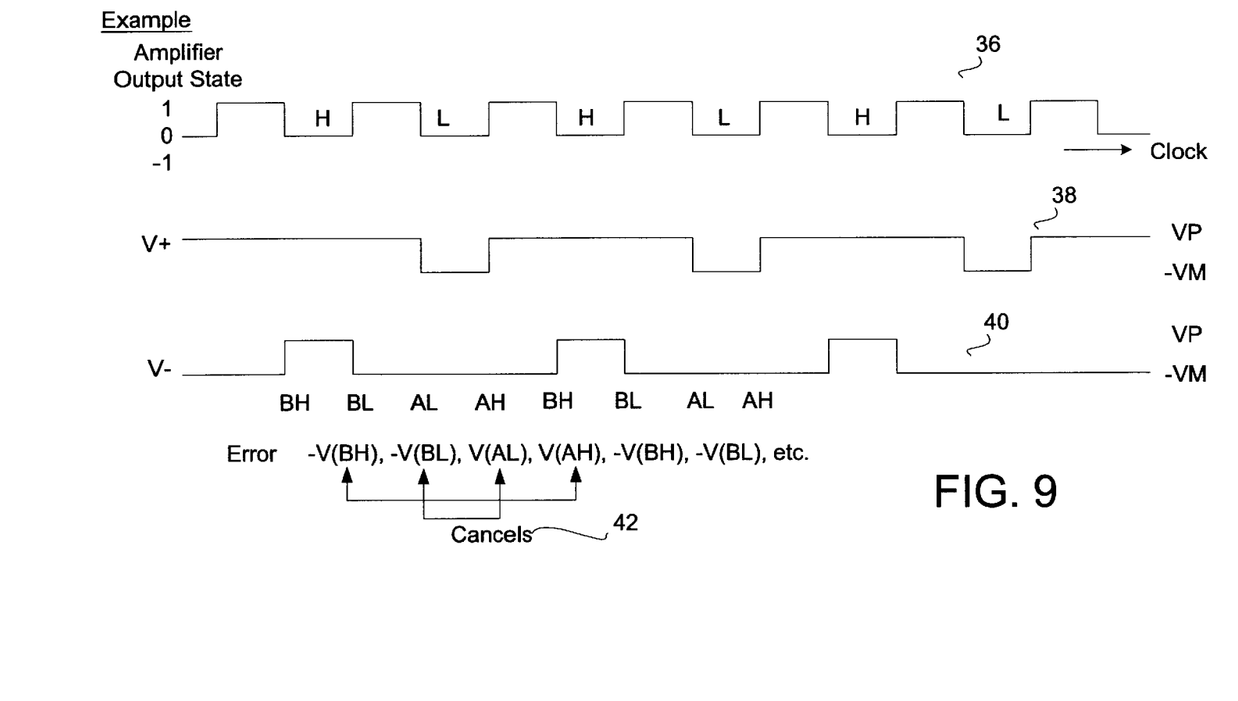
FIG. 9 shows an illustration of the error cancellation resulting from providing the return-zero quaternary switching control signal to the H-bridge circuit of FIG. 7.

FIG. 8 provides a sample illustration of state switching transitions produced by switch amplifier 100 according to the principles of this invention. As shown in FIGS. 8 and 9, between each non-zero state transition (i.e., from +1 to −1, +1 to +1, or −1 to −1, and −1 to +1 amplifier output state transition), switch amplifier 100 is forced to a 0 output state, the 0 state implemented by amplifier 100 alternating between a 0H and a 0L level as previously described in Table 3. The alternating of 0H and 0L states provides for error cancellation to minimize overall output error. As a further example of the error cancellation feature of this invention, FIG. 9 illustrates how during, for example transition from +1 to +1, the interim 0 state output levels alternate between a 0H and a 0L states, and during these transitions, either node V+ and V− is correspondingly switching.

As shown in FIG. 9 and Table 3, when output state first switch from +1 to 0H , switch AH remains close so that node V+ remains at VP, while BH switches from open to close to pull node V− up to VP. Since each switch transition produces an associated rise and fall time voltage error as explained earlier, this switching occurrence would produce an error value −V(BH) when switch BH closes At the next output transition from 0H to +1, AH remains close so that node V+ remains at VP, while BL switches close to pull node V− down to VM. This transitions produces error −V(BL). Then upon the next 0 state transition, alternating to 0L level this time (referring to Table 3), AL closes to pull node V+ down to VM, while BL remains close to keep node V− at VM. Error generated at this switching produces −V(AL). Further as output transitions back to +1 state at the next transition, AH closes to pull node V+ up to VP, while BL remains close and node V− remains at VM. Over time, the error collectively is represented by the following corresponding to switches turning ON and OFF, such as sequence BH, BL, AL, AH, BH, BL, etc.:

Error=[−V(BH)]+[−V(BL)]+[V(AL)]+[V(AH)]+[−V(BH)]+[−V(BL)]+ . . .

wherein V(BH) indicates error voltage caused by the finite rise and settling time of switch BH, and similarly for V(BL), V(AH) and V(AL).

The polarity sign associated with each V(BH), V(BL), V(AH), and V(AL) indicates whether that error voltage contributes to error at the positive (V+) or the negative (V−) node. With switch controls signals forcing the amplifier output to alternate between a 0H and a 0L in between each +1 or −1 amplifier output state, only error voltage coming from one switch contributes to output (V+−V−). Rise time of AH and BH are matched, while fall time of AL and BL are matched. Thus, V(AH)=V(BH), and V(AL)=V(BL). Error voltages in sequence provided above are therefore canceled.

Another illustration of the cancellation of error voltages for quaternary switching is illustrated as follow. Since 0H and 0L occur alternatively between two non-zero state +1 and −1, there are four types of switching:

1. 0H →+1→0L
2. 0H →−1→0L
3. 0L →+1→0H
4. 0L →−1→0H

Following the same derivation which gives the error voltages summarized in Table 2, the error voltage associate with the quaternary switching is as summarized in Table 4.

TABLE 4

Quaternary Switching Error Voltages

| Transition Type | OFF to ON at The First Edge | OFF to ON at The Second Edge | Error Voltage |
| --- | --- | --- | --- |
| 0H→+1→0L | BL | AL | −V(BL) + V(AL) ≅ 0 |
| 0H→−1→0L | AL | BL | V(AL) + V(BL) ≅ 0 |
| 0L→+1→0H | AH | BH | V(AH) − V(BH) ≅ 0 |
| 0L→−1→0H | BH | AH | −V(BH) + V(AH) ≅ 0 |

For each transition type in Table 4, the error voltages of the first and second transition edges cancel if the two top transistors AH and BH have the same rise time and the two bottom transistors AL and BL have the same fall time. Furthermore, a properly designed amplifier has the property that its switching frequency is much higher than the frequency of the actual input signal. The error voltage associated with the time difference between the two edges is very small in the interested input frequency range.

Figure 10:
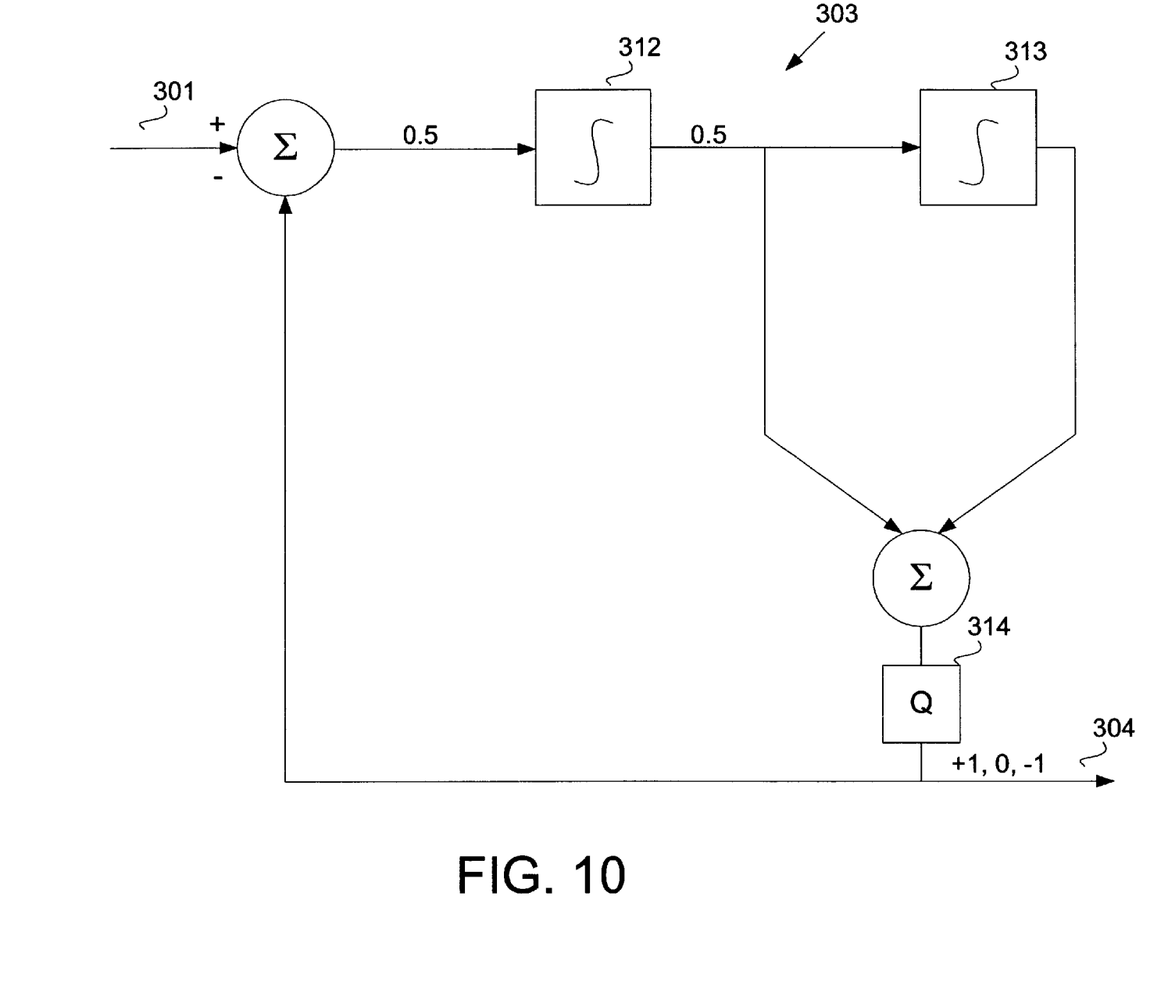
FIG. 10 shows the details of the block diagram of a three level second order sigma-delta modulator.
Figure 11:
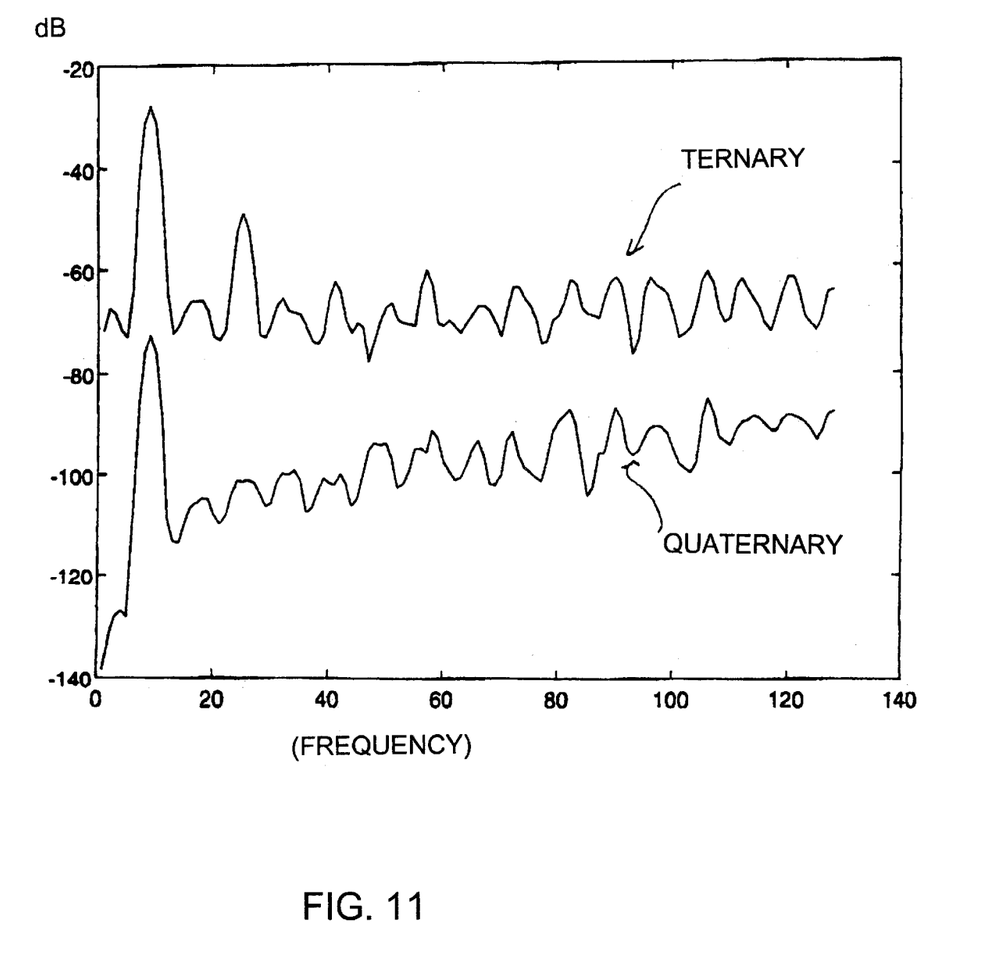
FIG. 11 shows the computer simulation results of the error voltages produced by ternary and quaternary switching amplifiers.

To further demonstrate the advantage of quaternary switching over ternary switching, we have performed a computer simulation. In this simulation, we assume that there are 20% error voltage for transistors AH and BH, and 10% error voltage for transistors AL and BL. The resulting simulation of switching amplifier 600 is shown in FIG. 11. A 1 KHz sine wave is provided as input signal 301, which is sampled by a sampling switch 302 with sampling rate of 6.144 MHz. The sampled data is then modulated by a second order three-level sigma-delta modulator 303. A detailed block diagram of the sigma-delta modulator is illustrated in FIG. 10. As shown in FIG. 10, second order modulator 303 comprises two integrators 312 and 313, and a three level quantizer 314. Modulator 303 produces a three level output (+1, 0, −1). The three level output is then mapped to quaternary states (+1, 0H , 0L , or −1) via mapping circuit 305 that maps 0 states in a ternary state output signal to a corresponding 0H or 0L state of a quaternary state signal. Referring back to FIG. 6, mapping is accomplished by a mapping circuit 305. In general, modulator 303 can be multi-level that it outputs (+m, +m−1, +m−2 . . . +2, +1, 0, −1, −2 . . . , −m) for 2 m+1 levels. A mapping circuits maps the multi-level outputs to quaternary control signals via the combination of the time division multiplex method and the mapping circuit 305. Also, modulator 303 can be of order higher than two, wherein it comprises more than two integrators. Quaternary state output signal 300 is provided as input signal to drive and control H-bridge circuit 100. To demonstrate the advantage quaternary switching over ternary switching, the ternary output 304 is used to control a ternary H-bridge 308, where the output nodes V+ and V− are pulled high during 0 state.

FIG. 11 provides Fast Fourier Transform (FFT) simulation results that analyzes the error voltages to show that a quaternary switching amplifier has much lower noise and harmonic distortion advantage over those of a ternary switching amplifier. As shown in FIG. 11, the noise floor is about 30 dB lower for quaternary switching amplifier and the second harmonic distortion is 50 dB lower. This simulation illustrates the significant advantage of quaternary switching amplifier over ternary switching amplifier. Thus, as illustrated, quaternary switching amplifier 100 provided according to the principles of this invention provides an improved switching amplifier having significantly lower noise and harmonic distortion.

Foregoing described embodiments of the invention are provided as illustrations and descriptions. They are not intended to limit the invention to precise form described. In particular, Applicant contemplates that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

What is claimed is:

1. A quaternary switching amplifier comprising:
   a quaternary amplifier input signal; and
   an H-bridge circuit, the H-bridge circuit is coupled to receive the quaternary input signal, the H-bridge comprising four input control signal ports coupled to receive the quaternary input signal to control an amplifier output of the H-bridge circuit to swing between a positive state (+1) and a negative state (−1) and to provide error cancellation in the amplifier output of the H-bridge circuit, the H-bridge circuit further comprising
   two pairs of switches, a first pair of switches including a first transistor (AH) and a second transistor (AL), and a second pair of switches comprising a third transistor (BH) and a fourth transistor (BL), a load coupled to the two pairs of switches via a positive node (V+) and a negative node (V−), the amplifier output of the H-bridge comprising a voltage difference across the load, between the node (V+) and the node (V−), wherein each transistor comprises a first terminal, a second terminal, and a third input switch control terminal, with a first terminal of transistors AH and BH coupled to a positive power supply (VP), and a second terminal of transistor AH coupled to the load via the positive node V+ and a second terminal of BH coupled to the load via the negative node V−, wherein a first terminal of AL and BL coupled to a negative power supply (VM), and a second terminal of transistor AL is coupled to the load via the node V+ and a second terminal of BL is coupled to the load via the node V−, and wherein the third input switch control terminal of each transistor is coupled to receive the quaternary input signal comprising a signal waveform alternating between a 0H state and a 0L state in between a non-zero state transition.

2. The switching amplifier of claim 1 wherein the quaternary signal is coupled to the H-bridge to synchronize switching close transistors AH and BH to pull both nodes V+ and V− to the positive power supply (VP).

3. The switching amplifier of claim 1 wherein the quaternary signal is coupled to the H-bridge to synchronize switching close transistors AL and BL to pull both nodes V+ and V− to the negative power supply (VM).

4. A quaternary switching amplifier comprising:

a switching control circuit including a multi-level nth sigma-delta modulator circuit to generate a quaternary input signal, the multi-level nth sigma-delta modulator circuit having an input summer circuit, a first integrator circuit coupled to the input summer circuit, n−1 integrator circuits where the nth integrator circuit is coupled to an output of the (n−1)th integrator circuit, n>1, a second summer circuit coupled to the output of the first integrator circuit and an output of the n−1 integrator circuits to generate a second summer circuit output, a multi-level quantizer coupled to receive the output of the second summer circuit and generating an output signal of the multi level quantizer comprising a multi level sequence of states ( . . . +3, +2, +1, 0, −1, −2, −3, . . . ), and a control circuit coupled to receive the output of the multi-level quantizer and generate the quaternary input signal, wherein the first input summer circuit is coupled to receive a switching amplifier input signal and the multi-level quantizer output signal to convert the switching amplifier input signal to a ternary state output signal; and an H-bridge circuit, the H-bridge circuit is coupled to receive the quaternary input signal, the H-bridge further comprising four input control signal ports coupled to receive the quaternary input signal to control an amplifier output of the H-bridge circuit to swing between a positive state (+1) and a negative state (−1) and to provide error cancellation in the amplifier output of the H-bridge circuit.

5. A quaternary switching amplifier method comprising:

coupling a quaternary switching amplifier input signal to a switch control circuit that generates a quaternary output signal, the quaternary output signal including non-zero positive (+1) states, non-zero negative (−1) states, zero high (0H) states, and zero low (0L) states, the quaternary output signal having a signal waveform alternating between 0H and 0L states in between each non-zero state transition; and coupling the quaternary output signal to an H-bridge circuit to provide error cancellation in an output of the H-bridge circuit.

6. A quaternary switching amplifier method comprising:

coupling a quaternary switching amplifier input signal to a switch control circuit that generates a quaternary output signal; and coupling the quaternary output signal to an H-bridge circuit to provide error cancellation in an output of the H-bridge circuit, the coupling of the quaternary output signal to the H-bridge further comprising switching two pairs of transistors to achieve one of four amplifier output states comprising a (+1) state, a (−1) state, a (0H) state, and a (0L) state, wherein between the (+1) state and the (−1) state, switching amplifier is switched either to the (0H) state or the (0L) state depending on the preceding switched output state, and wherein the step of switching to the (+1) state comprises synchronizing switching close a first transistor (AH) and a fourth transistor (BL), while synchronizing switching open a second transistor (AL) and a third transistor (BH), wherein the step of switching to the (0H) state comprises synchronizing switching dose AH and BH, while synchronizing switching open AL and BL, wherein the step of switching to the (−1) state comprises synchronizing switching open AH and BL, while synchronizing switching close AL and BL, and wherein the step of switching to the (0L) state comprises synchronizing switching open AH and BH, while synchronizing switching close AL and BL.

7. A quaternary switching amplifier comprising:

two pairs of switches, a first pair of switches comprising a first transistor (AH) and a second transistor (AL), and a second pair of switches comprising a third transistor (BH) and a fourth transistor (BL);

a load coupled to the two pairs of switches via a positive node (V+) and a negative node (V−);

an output of the switch amplifier comprising a voltage difference across the load, between the node (V+) and the node (V−); and wherein each transistor comprises a first terminal, a second terminal, and a third input switch control terminal, with a first terminal of transistors AH and BH coupled to a positive power supply (VP), and a second terminal of transistor AH coupled to the load via the positive node V+ and the second terminal of BH coupled to the load via negative node V−;

wherein a first terminal of AL and BL coupled to a negative power supply (VM), and the second terminal of transistor AL is coupled to the load via node V+ and a second terminal of BL is coupled to the load via node V−; and wherein the third input switch control terminal of each transistor is coupled to a clock signal to receive an quaternary input clock signal alternating between a 0H state and a 0L state between each positive +1 or negative −1 amplifier output state.

8. The switching amplifier of claim 7 wherein a first associated clock signal comprising the quaternary input clock is coupled to AH, and a second associated clock signal comprising the quaternary input clock is coupled to BH, and wherein the first associated clock and the second associated clock are synchronized to switch close AH and BH, respectively, to pull both nodes V+ and V− to a positive power supply (VP).

9. The switching amplifier of claim 7 wherein a third associated clock signal comprising the quaternary input clock is coupled to AL, and a fourth associated clock signal comprising the quaternary input clock is coupled to BL, and wherein the third associated clock and the fourth associated clock are synchronized to switch close AL and BL, respectively, to pull both nodes V+ and V− to a negative power supply VM.

10. A quaternary switching amplifier comprising:

a quaternary signal having non-zero positive (+1) states, non-zero negative (−1) states, zero high (0H) states, and zero low (0L) states, the quaternary signal having a signal waveform alternating between 0H and 0L states in between each non-zero state transition; and an H-bridge circuit coupled to receive the quaternary signal to control an amplifier output of the H-bridge circuit and to provide error cancellation in the amplifier output of the H-bridge circuit, the error cancellation provided by the signal waveform alternating between 0H and 0L states in between each non-zero state transition.

11. The quaternary switching amplifier of claim 10 wherein the H-bridge circuit comprises:

two pairs of switches, a first pair of switches including a first transistor (AH) and a second transistor (AL), and a second pair of switches comprising a third transistor (BH) and a fourth transistor (BL);

a load coupled to the two pairs of switches via a positive node (V+) and a negative node (V−);

the amplifier output of the H-bridge circuit comprising a voltage difference across the load, between the node (V+) and the node (V−);

wherein each transistor comprises a first terminal, a second terminal, and a third input switch control terminal, with a first terminal of transistors AH and BH coupled to a positive power supply (VP), and a second terminal of transistor AH coupled to the load via the positive node V+ and a second terminal of BH coupled to the load via the negative node V−;

wherein a first terminal of AL and BL coupled to a negative power supply (VM), and a second terminal of transistor AL is coupled to the load via the node V+ and a second terminal of BL is coupled to the load via the node V−; and wherein the third input switch control terminal of each transistor is coupled to receive the quaternary input signal.

12. The switching amplifier of claim 11 wherein the quaternary signal is coupled to the H-bridge to synchronize switching close transistors AH and BH to pull both nodes V+ and V− to the positive power supply (VP).

13. The switching amplifier of claim 11 wherein the quaternary signal is coupled to the H-bridge to synchronize switching close transistors AL and BL to pull both nodes V+ and V− to the negative power supply (VM).

14. The switching amplifier of claim 10 wherein a switching control circuit comprising a multi-level nth sigma-delta modulator circuit is provided to generate the quaternary input signal.

15. The switching amplifier of claim 14 wherein the multi-level nth sigma-delta modulator circuit comprises:

an input summer circuit;

a first integrator circuit coupled to the input summer circuit;

n−1 integrator circuits where the nth integrator circuit is coupled to an output of the (n−1)th integrator circuit, n>1;

a second summer circuit coupled to the output of the first integrator circuit and an output of the n−1 integrator circuits to generate a second summer circuit output;

a multi level quantizer coupled to receive the output of the second summer circuit and generating an output signal of the multi level quantizer comprising a multi level sequence of states ( . . . +3, +2, +1, 0, −1, −2, −3, . . . ); and a control circuit coupled to receive the output of the multi-level quantizer and generate the quaternary input signal, wherein the first input summer circuit is coupled to receive a switching amplifier input signal and the multi-level quantizer output signal to convert the switching amplifier input signal to a ternary state output signal.

* * * * *